(12) United States Patent
Kuo et al.

(10) Patent No.: US 9,261,534 B2
(45) Date of Patent: Feb. 16, 2016

(54) SHIELD PIN ARRANGEMENT

(75) Inventors: Yung-Hsin Kuo, Zhubei (TW); Po-Yi Huang, Kaohsiung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 563 days.

(21) Appl. No.: 13/559,875

(22) Filed: Jul. 27, 2012

(65) Prior Publication Data

US 2014/0028338 A1  Jan. 30, 2014

(51) Int. Cl.
 *G01R 31/00* (2006.01)
 *G01R 1/067* (2006.01)
 *G01R 1/18* (2006.01)
 *G01R 1/073* (2006.01)

(52) U.S. Cl.
 CPC .............. *G01R 1/06711* (2013.01); *G01R 1/18* (2013.01); *G01R 1/07314* (2013.01); *Y10T 29/49004* (2015.01)

(58) Field of Classification Search
 CPC ........... G01R 1/06727; G01R 1/06711; G01R 1/067; G01R 1/06716; G01R 31/2851; G01R 1/06722; G01R 1/06772; G01R 31/31905
 See application file for complete search history.

(56) References Cited

U.S. PATENT DOCUMENTS

| | | | | |
|---|---|---|---|---|
| 5,990,695 A | * | 11/1999 | Daugherty, Jr. | ........... 324/755.09 |
| 6,356,090 B2 | | 3/2002 | Deshayes | |
| 7,656,175 B2 | * | 2/2010 | Fukushima et al. | ....... 324/750.2 |

OTHER PUBLICATIONS

"Wafer Testing", Retrieved Jun. 4, 2012, pp. 1-3, http://en.wikipedia.org/wiki/Wafer_prober.

* cited by examiner

*Primary Examiner* — Tung X Nguyen
(74) *Attorney, Agent, or Firm* — Cooper Legal Group, LLC

(57) ABSTRACT

Among other things, one or more techniques and/or systems are provided for shielding a signal pin. A signal pin, such as a signal pin within a probe card used to test electronic devices, such as integrated circuits, is shielded from interference signals, which are emitted from other signal pins within the probe card. Shielding the signal pin mitigates cross-talk issues and/or impendence control issues associated with signals that are carried by the signal pin. In one example, one or more shield pins are arranged with respect to the signal pin according to a shield configuration. For example, the shield configuration comprises a plane of signal pins, a substantially regular layout of signal pins, or a polygonal layout of signal pins, etc. In this way, one or more shield pins inhibit unintended interactions or effects that otherwise occur among two or more signal pins.

20 Claims, 7 Drawing Sheets

US 9,261,534 B2

SHIELD PIN ARRANGEMENT

BACKGROUND

It is to be appreciated that an electronic device, such as an integrated circuit, can be tested to determine whether the electronic device operates as desired. An electronic device tester is configured to test an electronic device by sending signals to and/or receiving signals from an electronic device to determine whether the electronic device is operating correctly. Because an electronic device comprises a relatively small pitch, such as a distance between center points of data I/O ports, the electronic device tester interfaces with the electronic device through a probe card comprising a pitch corresponding to that of the electronic device. That is, the probe card comprises one or more signal pins configured to contact the electronic device. The electronic device tester sends input signals to the electronic device through one or more signal pins on the probe card that are in contact with the electronic device. The electronic device tester receives output signals from the electronic device through one or more signal pins on the probe card that are in contact with the electronic device. In this way, the electronic device tester tests the functionality of the electronic device by interfacing with the electronic device using the probe card.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

Among other things, one or more systems and/or techniques for shielding a signal pin are provided herein. A signal pin is configured to send signals to and/or receive signals from an electronic device, such as an integrated circuit under test. In one example, a probe card comprises one or more signal pins used to interface with the electronic device. An electronic device tester utilizes the probe card to interface with the electronic device for testing. The electronic device tester tests the functionality of the electronic device by sending signals to and/or receiving signals from the electronic device through one or more signal pins on the probe card that are in contact with the electronic device. Because the probe card comprises multiple signal pins, cross-talk issues, such as interference, and/or impedance issues, such as power loss, arise between signal pins. For example, such issues occur where two or more signal pins are in relatively close proximity to one another.

As provided herein, in some embodiments, one or more shield pins are arranged with respect to a signal pin based upon a shield configuration to, among other things, mitigate cross-talk and/or control impedance, which can otherwise manifest between the signal pin and one or more proximate signal pins. In one example, the one or more shield pins are arranged according to a substantially regular configuration with respect to the signal pin. For example, the substantially regular configuration comprises a square configuration, a rectangular configuration, a circular configuration, a polygonal configuration, a triangular configuration, a uniform configuration with respect to other signal pins, etc. In another example, the one or more shield pins are arranged according to a planar configuration. For example, a first group of the one or more shield pins are arranged in a first plane and a second group of the one or more shield pins are arranged in a second plane substantially parallel to the first plane. The signal pin is disposed between the first plane and the second plane. In this way, one or more shield pins shield the signal pin from interference signals originating from other signal pins. It is to be appreciated that a variety of shield configurations, such as shield pin layouts, shapes, sizes, materials, etc., are contemplated herein.

The following description and annexed drawings set forth certain illustrative aspects and implementations. These are indicative of but a few of the various ways in which one or more aspects may be employed. Other aspects, advantages, and/or novel features of the disclosure will become apparent from the following detailed description when considered in conjunction with the annexed drawings.

DETAILED DESCRIPTION

Figure 1:
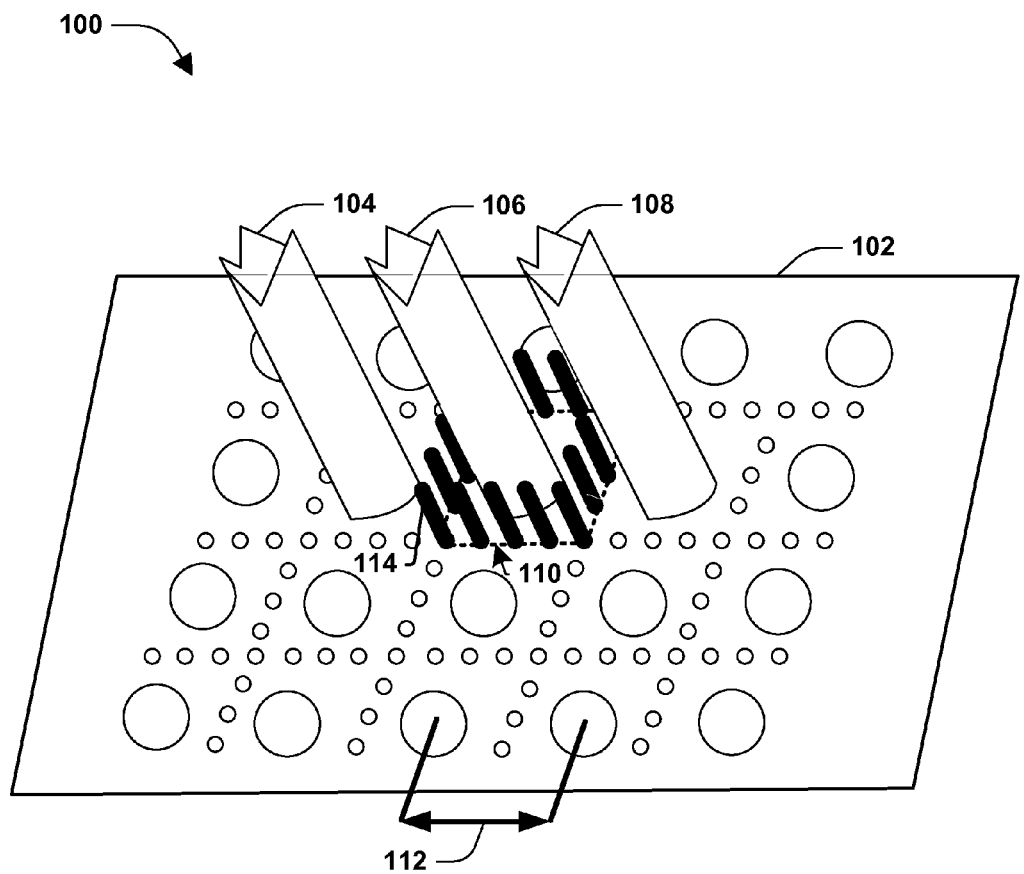
FIG. 1 is an illustration of an example of at least a portion of a probe card comprising an arrangement of one or more shield pins, in accordance with an embodiment.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are illustrated in block diagram form in order to facilitate describing the claimed subject matter.

An electronic device tester is configured to use a probe card to test an electronic device, such as an integrated circuit, to determine whether the electronic device operates as intended. Because of the relatively small size of electronic devices, the electronic device tester interfaces with an electronic device using a probe card comprising signal pins sized according to the size of the electronic device. In one example, an electronic device comprises 22 um diameter data I/O ports with 40 um pitch between center points of the data I/O ports, and a signal pin comprises a diameter of approximately 22 um. In some embodiments, a signal pin comprises a diameter of between about 22 um and about 40 um. The electronic device tester thus sends signals to and/or receives signals from the integrated circuit through one or more signal pins of the probe card to test the electronic device. Because cross-talk issues and/or impedance control issues can occur between signal pins within the probe card, it is advantageous to shield signal pins from interference signals as provided herein.

Accordingly, as provided herein, one or more shield pins are arranged with respect to a signal pin based upon a shield configuration. It is to be appreciated that a variety of shield configuration are contemplated herein, and that merely a few examples are discussed for illustrative purposes. In one example, the shield configuration comprises a substantially regular configuration. For example, the substantially regular configuration arranges the one or more shield pins according to a rectangular configuration, a square configuration, a circular configuration, a polygon configuration, a uniform configuration with respect to other signal pins, and/or a variety of other shape/size configurations. In another example of a shield configuration, a first group of shield pins are arranged in a first plane, and a second group of shield pins are arranged in a second plane parallel to the first plane. The signal pin is disposed between the first plane and the second plane. In this way, the one or more shield pins, arranged according to the shield configuration, mitigate cross-talk between signal pins and/or improve impedance control, which mitigates power loss of a signal pin. For example, a shield pin absorbs and/or grounds interference signals from a signal pin so that other signal pins are not affected by or are affected to a lesser extent by such interference signals. In an embodiment a shield pin comprises a diameter of about 22 um or less, but generally has a diameter that is less than a diameter of a signal pin that the shield pin is designed to shield. In an embodiment, a shield pin has a diameter that is at least one half less than the diameter of a signal pin that the shield pin is designed to shield so that the shield pin is able to be located near the signal pin, such as on a probe card, for example, but is also sufficient to shield the signal pin, such as by diverting interference signals from other signal pins away from the signal pin, for example.

FIG. 1 illustrates an example 100, in accordance with an embodiment, of a probe card 102 comprising an arrangement 110 of one or more shield pins. The probe card 102 comprises one or more signal pins, such as a first signal pin 104, a second signal pin 106, a third signal pin 108, etc., that are used to interface with an electronic device, such as an integrated circuit, (not shown). In one example, the first signal pin 104, the second signal pin 106, and/or the third signal pin 108 comprise pogo pins, vertical pins, and/or other pin types. Cross-talk between signal pins and/or impedance control issues arise because the one or more signal pins are arranged relatively closely to one another within the probe card. For example, a pitch 112 of the probe card 102 comprises a distance, such as 40 um, between center points of signal pins. Accordingly, the one or more shield pins, such as a shield pin 114, are arranged with respect to a signal pin to shield the signal pin from inference signals from other signal pins, which mitigates cross-talk and/or impedance control issues. It is to be appreciated that a variety of material and/or configurations can be used for a shield pin. For example, a shield pin can comprise a copper pillar and/or other material used to absorb interference signals.

In one example, one or more shield pins 114 are arranged in arrangement 110 with respect to the second signal pin 106 based upon a shield configuration. In one example, the shield configuration comprises a substantially regular configuration. For example, the shield configuration comprises a square configuration, such that the second signal pin 106 is disposed between one or more shield pins. It is to be appreciated that the one or more shield pins can be arranged according to a variety of shapes, sizes and/or configurations, such as a rectangular configuration, a circular configuration, etc. The second signal pin 106 is thus shielded from interference signals from the first signal pin 104, the third signal pin 108, and/or other signal pins not illustrated. For example, one or more shield pins, such as shield pin 114 and/or other shield pins, within the arrangement 110 absorb, attenuate, etc. interference signals from the first signal pin 104, such that the second signal pin 106 is shielded from the interference signals. For example, the one or more shield pins are connected to ground, such as through a ground bus or other grounding technique, to absorb the interference signals, for example. In this way, the second signal pin 106 carries a signal sent to the electronic device and/or a signal received from the electronic device while being shielded from interference from other signal pins. Although not illustrated, it is to be appreciated that other shield pins can be arranged with respect to other signal pins. For example, one or more shield pins can be arranged with respect to the first signal pin 104 and/or the third signal pin 108 according to a variety of configurations.

Figure 2:
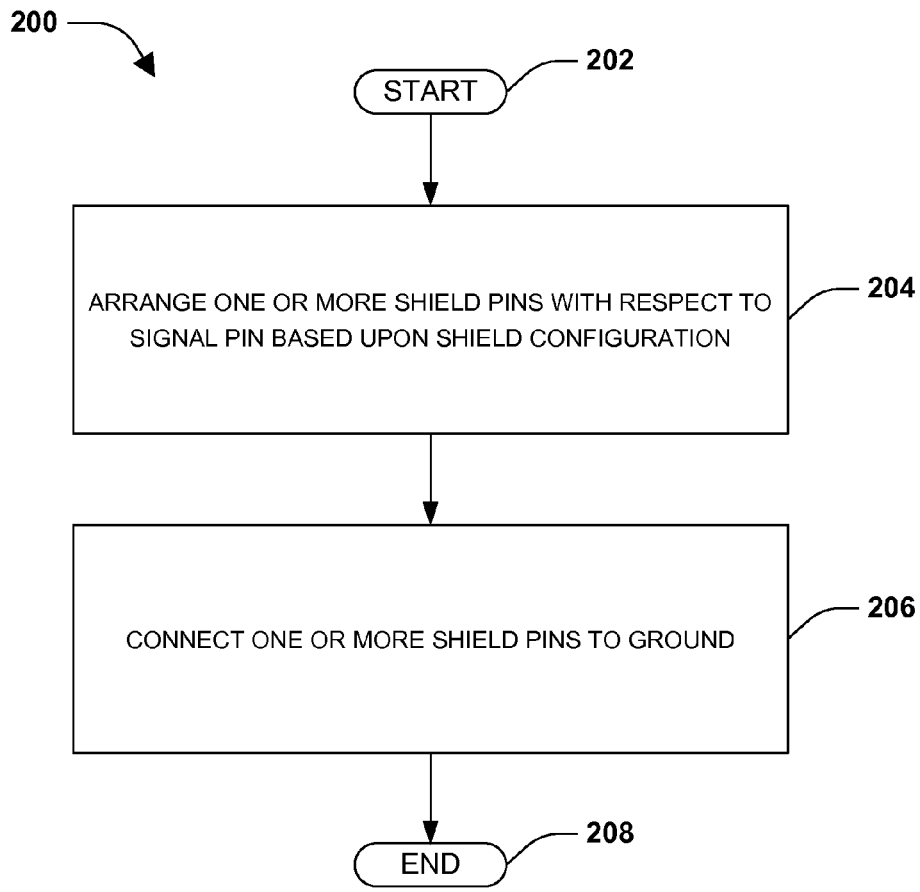
FIG. 2 is a flow diagram illustrating an example method of shielding a signal pin, in accordance with an embodiment.

An embodiment of shielding a signal pin is illustrated by an exemplary method 200 in FIG. 2. At 202, the method starts. At 204, one or more shield pins are arranged with respect to a signal pin based upon a shield configuration. The arrangement of the one or more shield pins shields the signal pin from interference signals, such as arising from signal pins adjacent to the signal pin within a probe card. The signal pin can comprise a pogo tip, a vertical tip, a cobra tip, and/or other tips. In one example, the one or more shield pins are arranged according to a substantially regular configuration, such as a square configuration, such that a signal pin is disposed between and/or surrounded by the one or more shield pins. In another example, a first group of the one or more shield pins is arranged in a first plane, and a second group of the one or more shield pins is arranged in a second plane parallel to the first plane. A signal pin is disposed between the first plane and the second plane, such that one or more shield pins within the first plane and/or the second plane shield the signal pin from interference signals. It is to be appreciated that signal pins comprising various types of tips can be shielded by the one or more shield pins.

The one or more shield pins are connected to ground, at 206. In one example, a first shield pin is connected to ground, such as through a ground bus and/or an interconnecting ground layer associated with the probe card. In another example, the one or more shield pins are connected to a ground bus to ground the one or more shield pins. In this way, the one or more shield pins discharge or route interference signals to ground.

In one example, the signal pin and/or other signal pins are comprised within a probe card. The probe card is used to interface with an electronic device. For example, an electronic device tester uses the probe card to test the electronic device to detect potential performance issues. The electronic device tester sends signals to the electronic device through the signal pin and/or receive signals from the electronic device through the signal pin. The one or more shield pins shield the signal pin from interference signals associated with other signal pins within the probe card. In this way, one or more shield pins arranged within the probe card mitigate cross-talk and/or impendence control issues during testing of the electronic device. At 208, the method ends.

Figure 3:
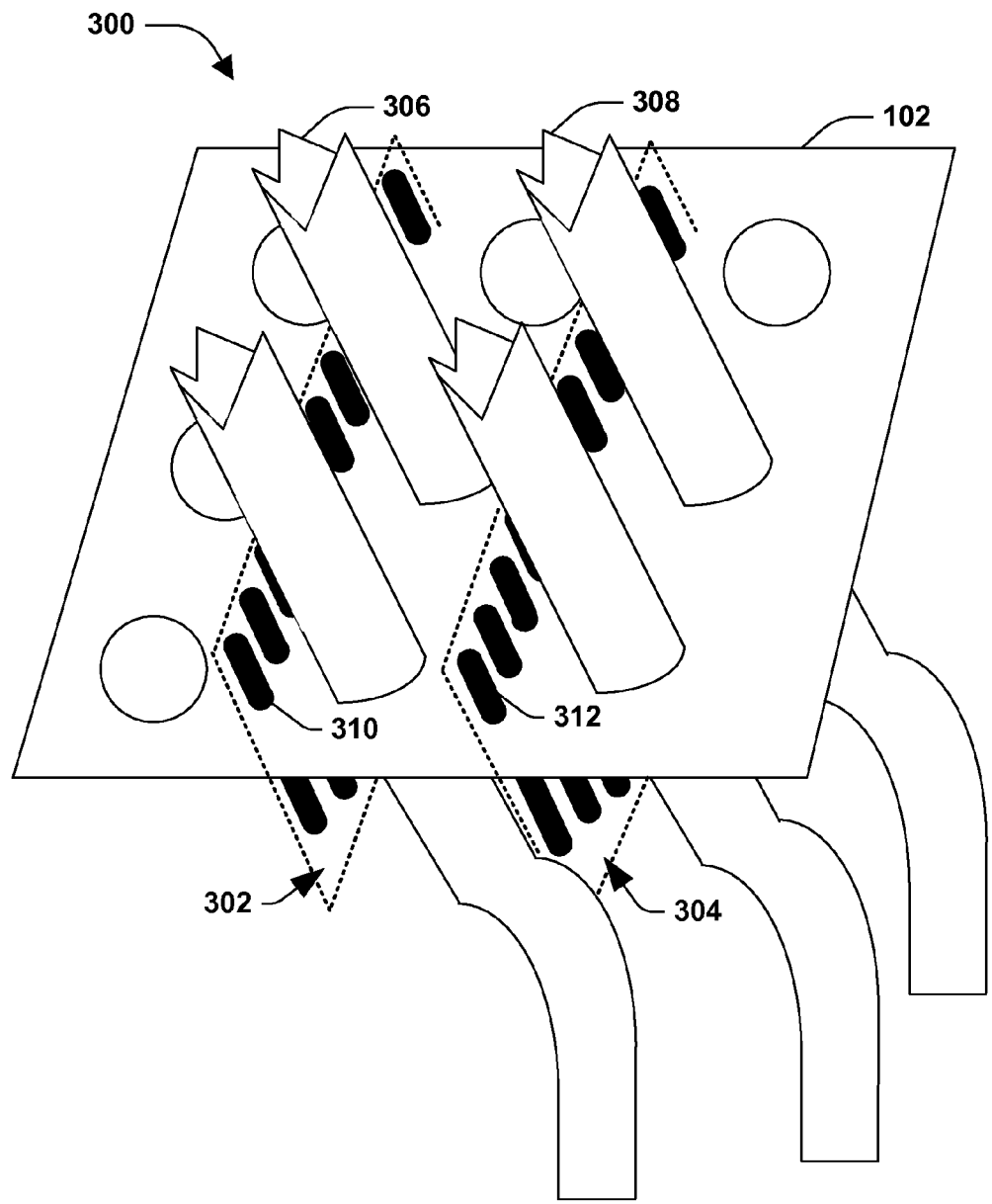
FIG. 3 is an illustration of an example of at least a portion of a probe card comprising an arrangement of one or more shield pins, in accordance with an embodiment.

FIG. 3 illustrates an example, in accordance with an embodiment, of a probe card 102 comprising an arrangement of one or more shield pins, such as shield pins 310, 312. The probe card 102 comprises one or more signal pins, such as a first cobra tipped signal pin 306, a second cobra tipped signal pin 308, etc., configured to carry signals associated with an electronic device (not shown). A signal pin, for example, serves as a conduit or medium through which a signal is sent to and/or received from the electronic device. One or more shield pins, such as shield pin 310, shield pin 312, and/or other shield pins, are arranged with respect to a signal pin based upon a shield configuration to shield the signal pin from interference signals.

In one example of a shield configuration, a first group of shield pins are arranged as a first plane 302, and a second group of shield pins are arranged as a second plane 304 substantially parallel to the first plane 302. A signal pin, such as the first cobra tipped signal pin 306 is disposed between the first plane 302 and the second plane 304. The one or more shield pins within the first plane 302 and/or the second plane 304 shield the first cobra tipped signal pin 306 from interference signals. For example, one or more shield pins within the second plane 304 absorb or ground interference signals from the second cobra tipped signal pin 308. In this way, signal pins within the probe card are shielded from interference signals, for example, when one or more of the signal pins are used to carry signals associated with the electronic device, such as during testing of the electronic device by an electronic device tester that utilizes the probe card to send signals to and/or receive signals from the electronic device. Because a cobra tipped signal pin comprises a bending portion that is formed to absorb stress when a leading end of the cobra tipped signal pin contacts an electronic device, such as an electrode of the electronic device, the shield configuration comprises the first plane 302 and the second plane 304 to accommodate the curvature of the bending portion. That is, the curvature of the bending portion is substantially parallel to the first plane 302 and the second plane 304, such that the curvature does not physically interfere with the shield configuration and vice versa. For example, surrounding the cobra tipped signal pin with shield pins on all sides, as opposed to using two planes, can physically interfere with the bending portion of the cobra tipped signal pin.

An embodiment of shielding a signal pin is illustrated by an exemplary method 400. At 402, the method starts. At 404, one or more shield pins are arranged with respect to a signal pin based upon a shield configuration. For example, a first group of the one or more shield pins are arranged in a first plane, at 406. A second group of the one or more shield pins are arranged in a second plane parallel or at least substantially parallel to the first plane, at 408. The first plane and the second plane are arranged such that the signal pin is disposed between the first plane and the second plane.

In one example, a probe card comprises the signal pin disposed between the first plane and the second plane, as well as other signal pins. The probe card is configured to interface with an electronic device during testing of the electronic device. The first plane and/or the second plane of shield pins are arranged within the probe card based upon the shield configuration to shield the signal pin from interference signals from other signal pins of the probe card. In this way, the signal pin and/or other signal pins are shielded from interference signals during testing of the electronic device. At 410, the method ends.

Figure 5:
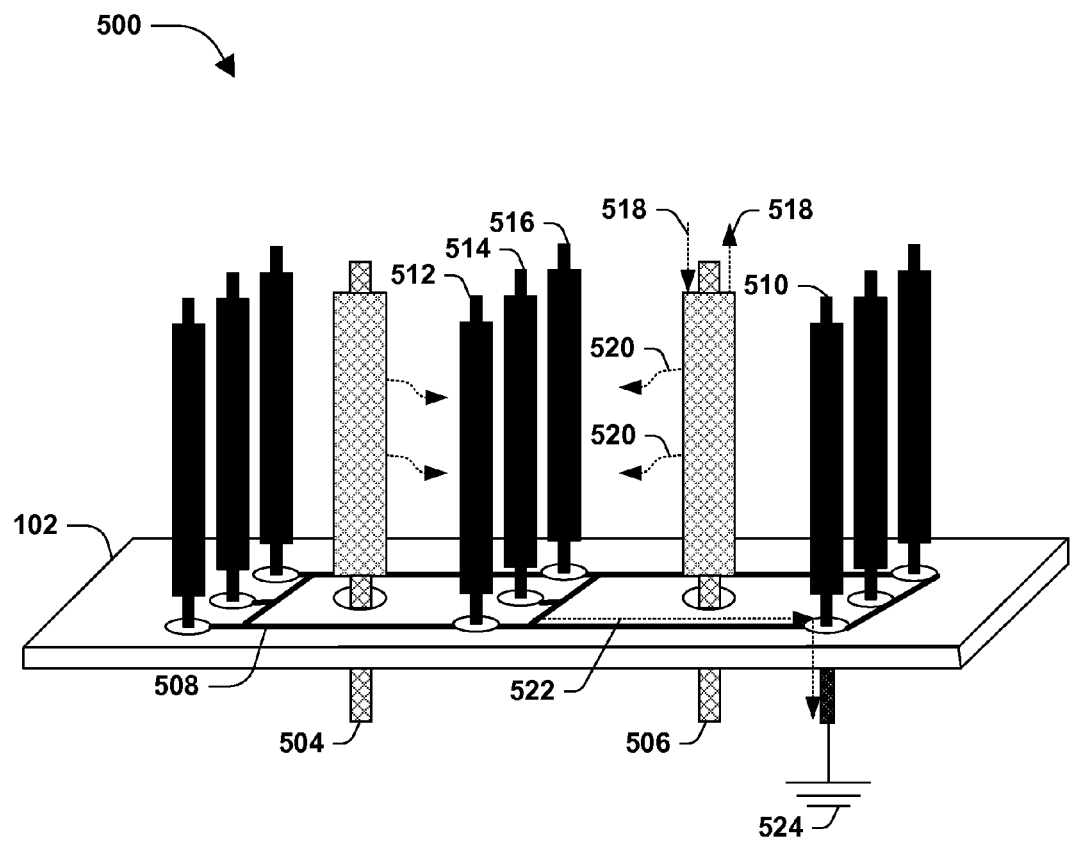
FIG. 5 is an illustration of an example of shielding one or more signal pins within a probe card, in accordance with an embodiment.

FIG. 5 illustrates an example 500, in accordance with an embodiment, of shielding one or more signal pins within a probe card 102. The probe card 102 comprises one or more signal pins, such as a first signal pin 504, a second signal pin 506, and/or other signal pins not illustrated. The probe card 102 is used to interface with an electronic device (not shown). For example, an electronic device tester sends signals to and/or receives signals from the electronic device, such as signals 518 associated with the second signal pin 506, using the one or more signal pins on the probe card 102. Interference, such as cross-talk, occurs between signal pins on the probe card 102, generally as a result of signals being conveyed by the signal pins. For example, as a result of a signal being carried by the second signal pin 506, the second signal pin 506 emits interference signals 520, which interfere with the first signal pin 504. For example, a signal being carried by the first signal pin 504 is affected by the inference signals 520.

Accordingly, one or more shield pins are arranged according to a shield configuration within the probe card 102 to shield the one or more signal pins within the probe card 102. For example, a first shield pin 512, a second shield pin 514, a third shield pin 516, and/or other shield pins are arranged with respect to the first signal pin 504 and/or the second signal pin 506 based upon a shield configuration. The one or more shield pins are connected to ground 524. For example, a grounded shield pin 510 is connected to ground 524. A ground bus 508 is connected to ground 524, such as through the grounded shield pin 510. The ground bus 508 is connected to the first shield pin 512, the second shield pin 514, the third shield pin 516, and/or other shield pins in order to ground such shield pins. In this way, a shield pin shields a signal pin by absorbing, attenuating, etc. interference signals. For example, an interference signal is grounded through a shield-pin connected to ground 524 via the ground bus 508. In one example, the interference signals 520, emitted by the second signal pin 506, are absorbed by the first shield pin 512, the second shield pin 514, the third shield pin 516, and/or other shield pins, such as through electromagnetic coupling, inductance, etc., for example, in order to shield the first signal pin 504 from the interference signals 520. The absorbed interference signals 522 are directed from the first shield pin 512, the second shield pin 514, the third shield pin 516, and/or other shield pins through the ground bus 508, to ground 524. In this way, one or more shield pins, such as the first shield pin 512, the second shield pin 514, and/or other shield pins, shield one or more signal pins within the probe card 102 from interference signals. As illustrated, in one example, the shield pins may be arranged in planes where one or more signal pins separate planes of signal pins, or rather are disposed between planes of shield pins.

Figure 6:
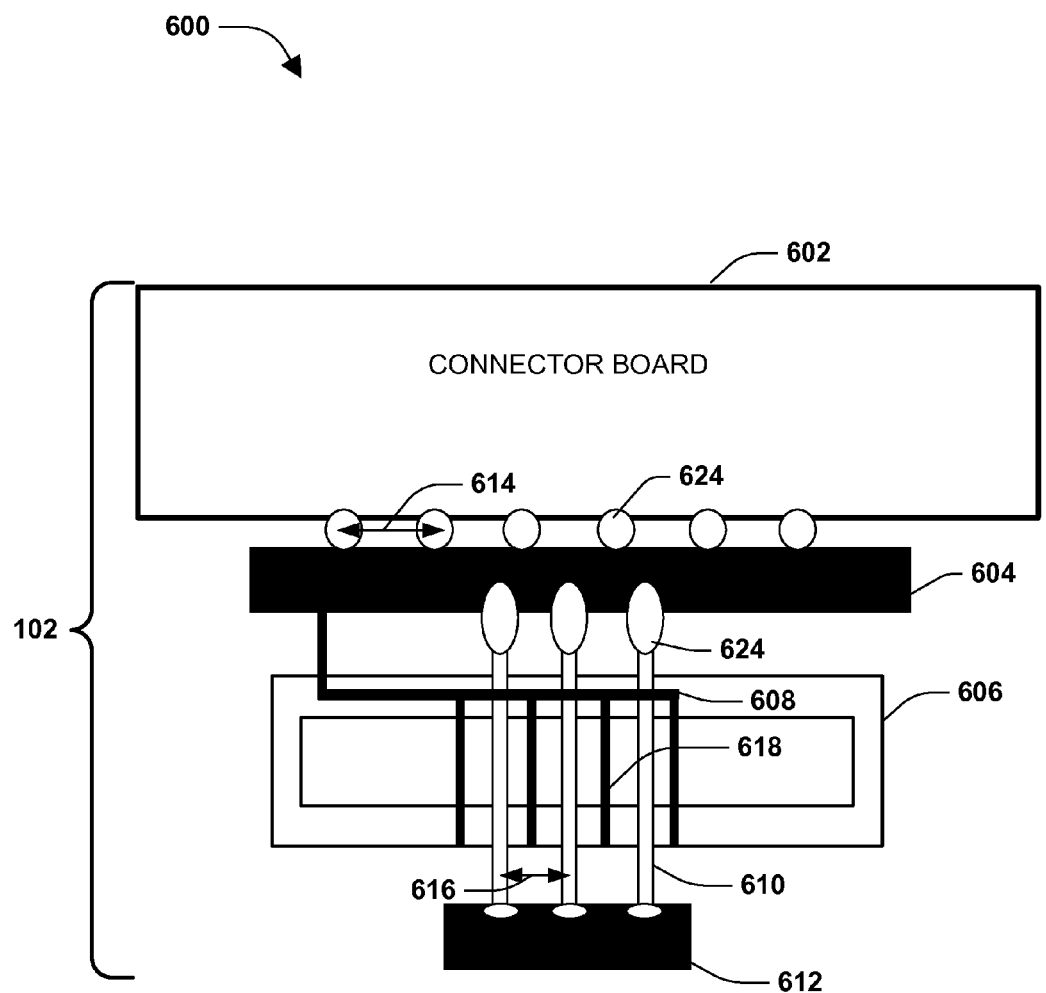
FIG. 6 is an illustration of an example of a probe card, in accordance with an embodiment.

FIG. 6 illustrates an example 600, in accordance with an embodiment, of probe card 102. In one example, the probe card 102 is configured to interface with an electronic device 612, such as a semiconductor wafer and/or one or more integrated circuits formed thereon. For example, an electronic device tester, such as electronic device tester 702 of FIG. 7, for example, utilizes the probe card 102 to carry signals sent to and/or received from the electronic device 612 to test the operability of the electronic device 612. The probe card 102 comprises a connector board 602 configured to connect the probe card 102 to a tester head of the electronic device tester, such as tester head 704 of FIG. 7, for example. In one example, the electronic device tester sends a signal from the tester head, through the connector board 602, to a signal pin 610 on the probe card 102. The signal is transmitted through the signal pin 610 to the electronic device 612, such as through a data I/O port of the electronic device 612 that is in electrical contact with the signal pin. In another example, the electronic device tester receives a signal from the electronic device 612. For example, a signal that is carried by a signal pin on the probe card 102 that is in electrical contact with a data I/O port of the electronic device 612 is received by the electronic device tester. The signal is received from the signal pin on the probe card 102, through the connector board 602, at the tester head.

The probe card 102 comprises a connectivity layer 604. The connectivity layer 604 is used as a space transformer to change from a relatively large pitch 614, such as a distance greater than 40 um between center points of pins, of the connector board 602 to a relatively small pitch 616, such as 40 um or less between center points of signal pins 610, corresponding to a pitch of the electronic device 612. That is, because the electronic device 612 comprises a relatively small pitch 616, the connectivity layer 604 is used to transfer signals from pins on the connector board 602 having relatively large pitch 614 to data I/O ports on the electronic device 612 having relatively small pitch 616. The connectivity layer 604 is operably, such as electrically, coupled to the connector board 602 and/or the signal pins 610 via soldered connections 624, for example.

The probe card 102 comprises a probe head 606. The probe head 606 comprises a container for housing one or more signal pins 610 and/or one or more shield pins 618 within the probe card 102. The probe head 606 comprises a grounding component 608, such as a ground bus and/or other circuitry for connecting pins, such as shield pins, within the probe card 102 to ground.

The probe card 102 comprises one or more signal pins, such as signal pin 610. A signal pin is used to carry signals associated with the electronic device 612, such as signals sent to the electronic device 612 by the electronic device tester and/or signals received from the electronic device 612 for the electronic device tester. For example, the signal pin 610 contacts the connectivity layer 604 so that one or more signals or signal data is transferred between the signal pin 610 and the electronic device tester. The signal pin 610 contacts the electronic device 612, such as at a data I/O port, so that one or more signals or signal data is transferred between the signal pin 610 and the electronic device 612.

The probe card 102 comprises one or more shield pins 618 arranged according to a shield configuration. For example, one or more shield pins are arranged with respect to one or more signal pins within the probe head 606 according to the shield configuration to shield one or more signals pins within the probe card 102 from interference signals, which are emitted from other signal pins, such as an adjacent signal pin. Shield pins 618 are connected to the grounding component 608 so that interference signals carried by such shield pins are absorbed and/or transferred to ground. The shield pins 618 thus shields signal pins 610 from interference signals.

Figure 7:
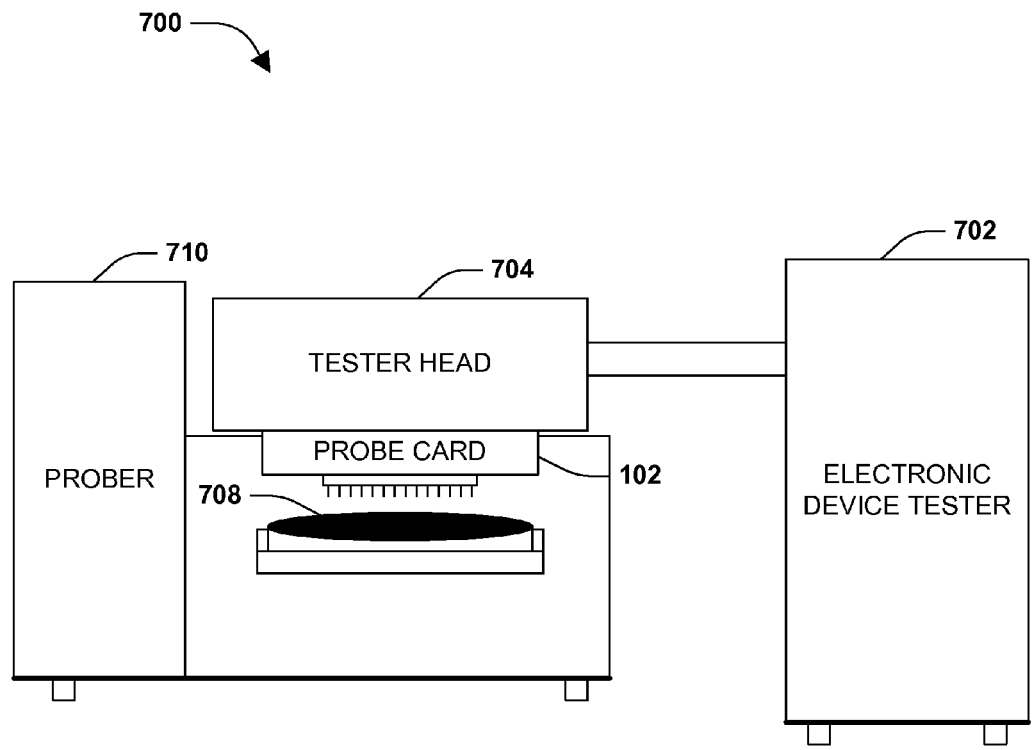
FIG. 7 is an illustration of an example of an electronic device tester, in accordance with an embodiment.

FIG. 7 illustrates an example 700, in accordance with an embodiment, of an electronic device tester 702. The electronic device tester 702 is configured to test the functionality of electronic devices, such as one or more integrated circuits formed on a semiconductor wafer 708. The electronic device tester 702 sends signals to the semiconductor wafer 708. For example, the electronic device tester 702 sends an input value to a first data I/O port of an integrated circuit on the semiconductor wafer 708 and receives signals in response thereto. For example, the electronic device tester 702 receives an output value from a second data I/O port of the integrated circuit in response to a sent input signal. In this way, the electronic device tester 702 tests the integrated circuit to determine whether the integrated circuit is functioning correctly.

Because the integrated circuit comprises one or more data I/O ports having relatively small pitch, the electronic device tester 702 utilizes a prober 710 to interface with the integrated circuit. The electronic device tester 702 comprises a tester head 704 configured to interface with a probe card 102 of the prober 710. The probe card 102 comprises one or more signal pins configured to make electrical contact with the integrated circuit. For example, a signal pin contacts a data I/O port of the integrated circuit. In this way, the electronic device tester 702 interfaces with the integrated circuit through the tester head 704 and the probe card 102 of the prober 710. In one example, the electronic device tester 702 sends an input test signal from the tester head 704, through one or more signal pins of the probe card 102, to the integrated circuit on the semiconductor wafer 708. In another example, the electronic device tester 702 receives an output test signal from the integrated circuit on the semiconductor wafer 708, through one or more signal pins on the probe card 102, at the tester head 704. In this way, the electronic device tester 702 tests the functionality of the integrated circuit on the semiconductor wafer 708.

Because cross-talk issues, where a signal on a first signal pin is influenced by a signal on a second signal pin, for example, and/or impedance control issues, such as power loss associated with the signal that is to be carried by the first signal pin, for example, associated with signal pins of the probe card 102 can arise, one or more shield pins are arranged within the probe card 102 according to a shield configuration. The one or more shield pins are arranged with respect to a signal pin in order to shield the signal pin from interference signals. Shielding the signal pin, among other things, mitigates cross-talk issues and/or impedance control issues, for example.

According to an aspect of the instant disclosure, a method for shielding a signal pin is provided. The method comprises arranging one or more shield pins with respect to the signal pin based upon a shield configuration. Also, a first shield pin of the one or more shield pins is connected to ground.

According to an aspect of the instant disclosure, a probe card for testing an electronic device is provided. The probe card comprises a signal pin configured to carry a signal. The probe card comprises one or more shield pins arranged according to a shield configuration with respect to the signal pin. The one or more shield pins are configured to shield the signal pin from an interference signal.

According to an aspect of the instant disclosure, a method for shielding a signal pin is provided. The method comprises arranging one or more shield pins with respect to the signal pin based upon a shield configuration. A first group of the one or more shield pins is arranged in a first plane. A second group of the one or more shield pins is arranged in a second plane. The second plane is parallel to the first plane, and the signal pin is disposed between the first plane and the second plane.

Figure 4:
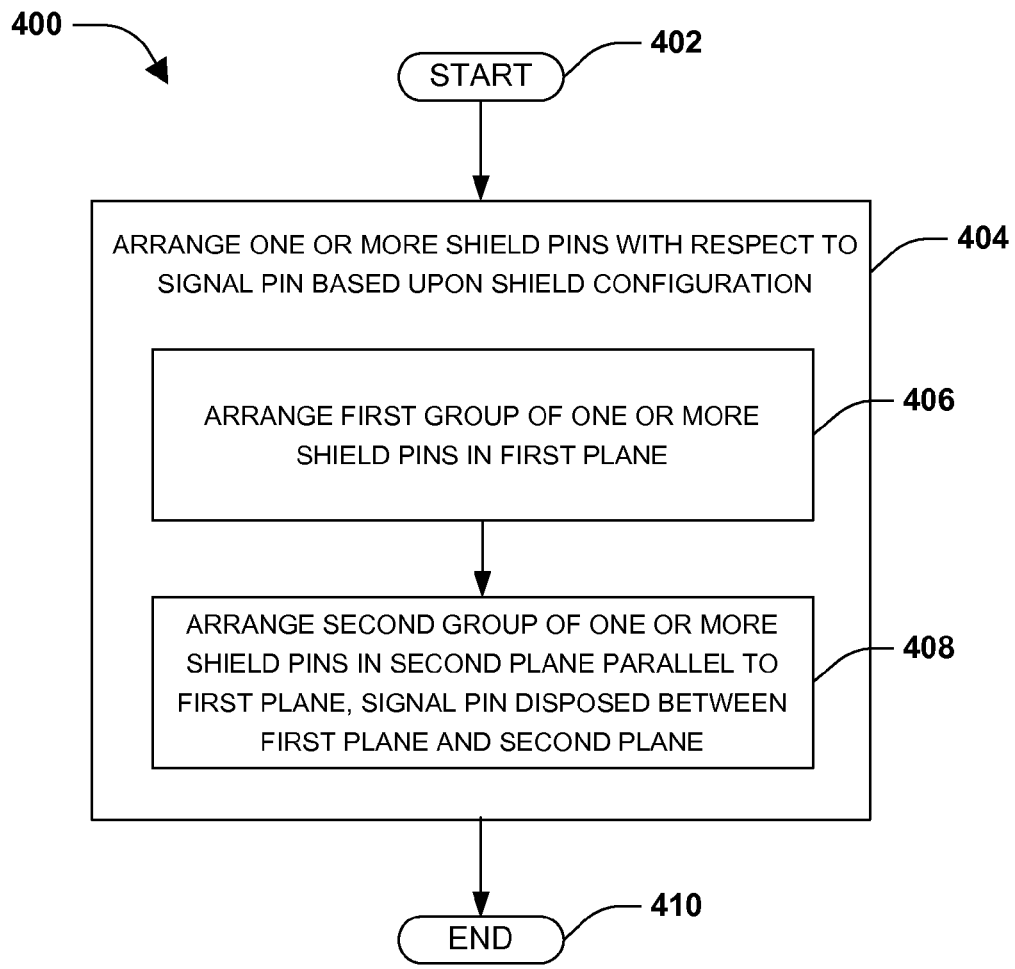
FIG. 4 is flow diagram illustrating an example method of shielding a signal pin, in accordance with an embodiment.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. For example, the arrangements/orders of the acts illustrated in FIG. 2 and/or in FIG. 4 are merely examples, and some acts may be performed concurrently, some acts may be independent of other acts and/or some acts may be optional such that a method may be performed without one or more acts.

As used in herein "or" is intended to mean an inclusive "or" rather than an exclusive "or". In addition, "a" and "an" as used herein may generally be construed to mean "one or more" unless specified otherwise or clear from context to be directed to a singular form. Also, at least one of A and B and/or the like generally means A or B or both A and B.

Also, although the application has been shown and described with respect to one or more implementations, equivalent alterations and modifications will occur to others of ordinary skill in the art based upon a reading and understanding of this specification and the annexed drawings. The application includes all such modifications and alterations. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function. In addition, while a particular feature of the application may have been disclosed with respect to only one of several implementations, such feature may be combined with one or more other features of the other implementations as may be desired and/or advantageous for any given or particular application. Furthermore, to the extent that "includes", "having", "has", "with" and/or the like are used herein, such terms are intended to be inclusive in a manner similar to "comprising."

What is claimed is:

1. A probe card for testing an electronic device comprising:
  a signal pin configured to carry a signal;
  a first set of one or more shield pins lying within a first plane; and
  a second set of one or more shield pins lying within a second plane different than the first plane, the first set and the second set of one or more shield pins configured to shield the signal pin from an interference signal.

2. The probe card of claim 1, the probe card configured to: carry a signal, associated with an electronic device that is to be tested, through the signal pin within the probe card, the signal shielded by at least one signal pin of at least one of the first set or the second set of one or more shield pins from one or more additional signals associated with one or more additional signal pins associated with the probe card.

3. The probe card of claim 1, the probe card configured to: carry a signal between an electronic device and an electronic device tester using the signal pin.

4. The probe card of claim 1, the signal pin comprising at least one of a pogo tip, a vertical tip, or a cobra tip.

5. The probe card of claim 1, at least some of at least one of the first set or the second set of one or more shield pins comprising a copper pillar.

6. A probe card for testing an electronic device comprising:
  a signal pin configured to contact an electronic device for testing the electronic device; and
  a first set of one or more shield pins configured to receive interference signals originating from the signal pin, the signal in comprising a bendable portion configured to bend within a first plane and the first set of one or more shield pins lying within a second plane parallel to the first plane.

7. The probe card of claim 6, the signal pin having a first diameter and at least some of the one or more shield pins having a second diameter different than the first diameter.

8. The probe card of claim 7, the second diameter less than the first diameter.

9. The probe card of claim 7, the second diameter no more than one-half the first diameter.

10. The probe card of claim 6, the first set of one or more shield pins coupled to ground.

11. The probe card of claim 6, the signal pin having a first height and at least some of the one or more shield pins having a second height different than the first height.

12. The probe card of claim 6, comprising:
  a second set of one or more shield pins lying within a third plane.

13. The probe card of claim 12, the third plane parallel to the first plane.

14. The probe card of claim 11, the second height less than the first height.

15. The probe card of claim 6, comprising:
  a grounding bus to which the first set of one or more shield pins is connected, the grounding bus configured to be connected to ground to ground the first set of one or more shield pins.

16. The probe card of claim 6, the one or more shield pins of the first set comprising copper.

17. A probe card for testing an electronic device comprising:
  a signal pin configured to contact an electronic device for testing the electronic device;
  a first set of shield pins configured to receive interference signals originating from the signal pin, the first set of shield pins lying within a first plane; and
  a second set of shield pins lying within a second plane different than the first plane.

18. The probe card of claim 17, the second plane parallel to the first plane.

19. The probe card of claim 18, comprising a third set of shield pins lying within a third plane, the third plane orthogonal to the first plane and the second plane.

20. The probe card of claim 17, the second plane orthogonal to the first plane.

* * * * *